United States Patent
Choi et al.

(10) Patent No.: US 9,530,529 B2
(45) Date of Patent: Dec. 27, 2016

(54) RADIOISOTOPE BATTERY AND MANUFACTURING METHOD THEREOF

(71) Applicant: Electronics and Telecommunications Research Institute, Daejeon (KR)

(72) Inventors: Byoung-Gun Choi, Daejeon (KR); Sung-Weon Kang, Daejeon (KR); Kyung-Hwan Park, Daejeon (KR); Myung-Ae Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 739 days.

(21) Appl. No.: 14/249,942

(22) Filed: Apr. 10, 2014

(65) Prior Publication Data

US 2014/0319963 A1 Oct. 30, 2014

(30) Foreign Application Priority Data

Apr. 26, 2013 (KR) ........................ 10-2013-0046763

(51) Int. Cl.
*G21H 1/06* (2006.01)
*H01L 31/115* (2006.01)

(52) U.S. Cl.
CPC ............... *G21H 1/06* (2013.01); *H01L 31/115* (2013.01)

(58) Field of Classification Search
CPC ........... H01L 31/04; H01L 31/115; G21H 1/06
USPC ............................................ 310/303; 438/56
See application file for complete search history.

(56) References Cited

U.S. PATENT DOCUMENTS

| 5,606,213 A | 2/1997 | Kherani et al. |
| 7,939,986 B2 | 5/2011 | Chandrashekhar et al. |
| 2002/0017650 A1* | 2/2002 | Nikolaev ............... B82Y 10/00 257/82 |
| 2009/0026879 A1* | 1/2009 | Prelas ...................... G21H 1/06 310/303 |
| 2012/0133244 A1* | 5/2012 | Spencer ................... G21H 1/02 310/303 |
| 2013/0154438 A1* | 6/2013 | Tan Xing Haw ........ G21H 1/06 310/303 |

FOREIGN PATENT DOCUMENTS

| KR | 100934937 B1 | 12/2009 |
| KR | 100935351 B1 | 12/2009 |

* cited by examiner

*Primary Examiner* — Thanh Lam
(74) *Attorney, Agent, or Firm* — William Park & Associates Ltd.

(57) ABSTRACT

This invention relates to a radioisotope battery and a method of manufacturing the same, wherein manufacturing the radioisotope battery and shielding radiation emitted from the radioisotope Ni-63 from the outside are achieved simultaneously. This radioisotope battery includes a semiconductor layer, a seed layer formed on the semiconductor layer, a radioisotope layer formed on the seed layer, and a radiation shielding layer formed on the radioisotope layer and for shielding radiation of the radioisotope layer form the outside.

10 Claims, 2 Drawing Sheets

RADIOISOTOPE BATTERY AND MANUFACTURING METHOD THEREOF

CROSS REFERENCE TO RELATED APPLICATION

This application claims the benefit of Korean Patent Application No. KR 10-2013-0046763, filed Apr. 26, 2013, which is hereby incorporated by reference in its entirety into this application.

BACKGROUND OF THE INVENTION

1. Technical Field

The present invention relates to a radioisotope battery and a manufacturing method thereof, and more particularly, to a radioisotope battery having deposited radioisotope Ni-63 and to a method of manufacturing the same.

2. Description of the Related Art

Generally, a radioisotope is an element which is radioactive among isotopes of any element. Radioisotopes have different decay methods depending on the kinds thereof, and emit radiations having unique energy and are decayed into stable isotopes.

The decay methods include not only α, β–, β+ decay but also EC decay wherein an atomic nucleus captures K-orbital electrons. Most of the radioisotopes emit extra energy as alpha rays, beta rays or gamma rays and finally become stable isotopes. The amount of the radioisotope is represented by radioactive intensity, that is, the number of decay processes per unit time.

A conventional isotope battery using beta-rays is configured such that a Ni-63 foil or a sealed ray source as a beta-ray emitter is placed on a Si PN junction structure to thus absorb beta-rays, thereby generating current. When the semiconductor PN junction process and the fabrication of the beta-ray source are separately performed in this way, beta-rays may be emitted to the outside. To shield such rays, an additional shielding package has to be provided outside the isotope battery.

Upon manufacturing the isotope battery, because a series of processes, including performing a semiconductor process, manufacturing a beta-ray source, assembling a semiconductor-beta-ray source, forming a shielding structure, etc. are separately implemented, the fabrication of the isotope battery becomes complicated and difficult.

As a related technique, generation of current for a long period of time using radiation of an isotope is disclosed in Korean Patent No. 0935351 (entitled "A Method for Power Increase in a Nuclear-Cell and A High Efficiency Beta-Cell Using It").

As disclosed in Korean Patent No. 0935351, in the method of increasing charge in the beta battery for irradiating beta-rays generated from a radioisotope onto a semiconductor to thus achieve charge generation, a plurality of PN junctions comprising a P-type impurity and an N-type impurity formed on a Si substrate is continuously arranged in a transverse direction so that the area of the depletion layer is distributed largely toward the inside from one or both sides of the Si substrate, and one-side ends of the same type of impurities are connected to thus form a comb structure. Furthermore, an insulating layer is formed over the entire upper surface of the PN junctions formed in a transverse direction, after which a layer of any one isotope selected from among 63Ni, 3H and He for generating radiation over the area corresponding to the PN junction region is formed thereon. As such, the sum of the depth of the PN junction and the thickness of the insulating layer is formed so as to correspond to the range of radiation emitted from the isotope layer, and thereby the radiation reaches the lower portion of the depletion layer of the PN junction diode formed in a transverse direction, ultimately increasing the amount of generated charge without a reduction in electric field $\epsilon$.

As another related technology, a Schottky assembly is used as a current generation source in lieu of a PIN semiconductor, provided that the radioisotope layer is stacked on only either of the metal and the semiconductor, thereby preventing a short-circuit through the radioisotope layer in the current flow between the metal and the semiconductor, which is disclosed in Korean Patent No. 0934937 (entitled "Radioisotope Battery").

The invention disclosed in Korean Patent No. 0934937 comprises an insulating substrate; a Schottky assembly comprising a deposited Schottky semiconductor layer and a deposited Schottky metal thin film layer; a deposited radioisotope layer; and electrode pads formed on portions of the Schottky semiconductor layer and the Schottky metal thin film layer.

However, Korean Patent Nos. 0935351 and 0934937 as above did not take into consideration the radioisotope Ni-62 to prevent human bodies from being exposed to radiation emitted from the radioisotope Ni-63.

SUMMARY OF THE INVENTION

Accordingly, the present invention has been made keeping in mind the above problems encountered in the related art, and an object of the present invention is to provide a radioisotope battery and a method of manufacturing the same, wherein manufacturing the radioisotope battery and shielding radiation emitted from the radioisotope Ni-63 from the outside may be achieved simultaneously.

In order to accomplish the above object, a preferred aspect of the present invention provides a radioisotope battery, comprising a semiconductor layer; a seed layer formed on the semiconductor layer; a radioisotope layer formed on the seed layer; and a radiation shielding layer formed on the radioisotope layer and for shielding radiation of the radioisotope layer from the outside.

Preferably, the radiation shielding layer comprises Ni-62, and the radioisotope layer comprises Ni-63.

Preferably, the semiconductor layer is a PN junction semiconductor layer where a P-type impurity layer and an N-type impurity layer are in contact with each other, and the seed layer is formed on the P-type impurity layer.

Preferably, the seed layer comprises Ni-62.

In addition, another preferred aspect of the present invention provides a method of manufacturing a radioisotope battery, comprising preparing a semiconductor layer; depositing a seed layer on the semiconductor layer; depositing a radioisotope layer on the seed layer; and forming a radiation shielding layer for shielding radiation of the radioisotope layer from the outside on the radioisotope layer.

Preferably, the radiation shielding layer comprises Ni-62, and forming the radiation shielding layer is performed by subjecting Ni-62 to vacuum deposition or plating on the radioisotope layer.

Preferably, the radioisotope layer comprises Ni-63, and depositing the radioisotope layer is performed by depositing Ni-63 using plating.

Preferably, the semiconductor layer is a PN junction semiconductor layer where a P-type impurity layer and an N-type impurity layer are in contact with each other, and depositing the seed layer is performed by depositing the seed layer on the P-type impurity layer.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
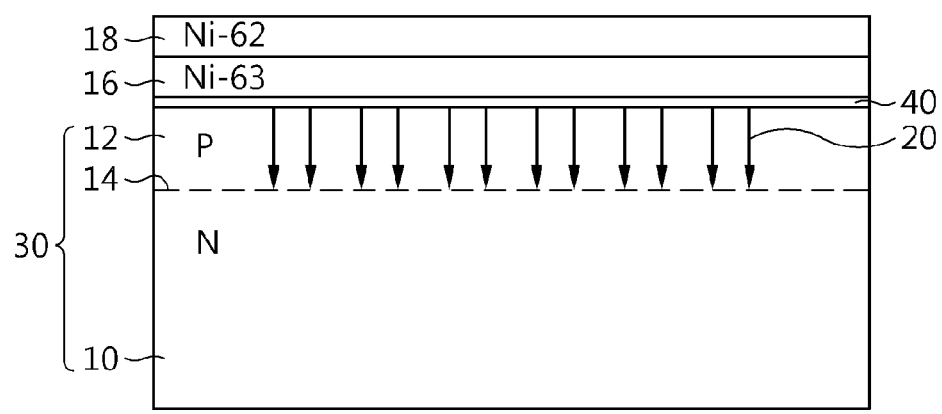
FIG. 1 is a cross-sectional view illustrating the structure of a radioisotope battery according to an embodiment of the present invention.

Hereinafter, a detailed description will be given of a radioisotope battery and a method of manufacturing the same according to embodiments of the present invention with reference to the appended drawings. Throughout the detailed description, the terms or words used in the following present specification and claims are not construed limitedly as typical or dictionary meanings. Therefore, the examples described in the present specification and the constructions illustrated in the drawings are merely preferred embodiments of the present invention, and do not represent all of the technical ideas of the present invention, and thus, it is to be understood that a variety of equivalents and modifications able to substituted therefor may be provided at the point of time of the present invention being filed.

FIG. 1 is a cross-sectional view illustrating the structure of a radioisotope battery according to an embodiment of the present invention.

According to the embodiment of the present invention, the radioisotope battery includes a semiconductor layer 30, a seed layer 40, a radioisotope layer 16, and a radiation shielding layer 18.

The semiconductor layer 30 functions as a base, and has a PN junction structure where a P-type impurity layer 12 (a P region) and an N-type impurity layer 10 (an N region) are in contact with each other. Preferably, the P-type impurity layer 12 is disposed on the N-type impurity layer 10. Also, the interface between the P-type impurity layer 12 and the N-type impurity layer 10 refers to a PN junction surface 14.

The seed layer 40 is used to deposit (plate) the radioisotope layer 16, and is formed of Ni-62 which is regarded as the most stable element among all elements. More specifically, the seed layer 40 is formed on the P-type impurity layer 12 of the semiconductor layer 30.

The radioisotope layer 16 is formed on the seed layer 40. The radioisotope layer 16 emits radiation (e.g. beta-rays) and thus supplies an energy source to the semiconductor layer 30. Preferably, the radioisotope layer 16 may be composed of Ni-63 for emitting beta-rays.

The radioisotope layer 16 is deposited on the seed layer 30, and Ni-63 is preferably deposited using a plating process to prevent pollution due to sputtering of Ni-63.

The radiation shielding layer 18 is formed on the radioisotope layer 16. The radiation shielding layer 18 plays a role in shielding radiation of the radioisotope layer 16. The radiation shielding layer 18 is preferably composed of Ni-62. Because Ni-62 has the highest binding energy between nuclei among all elements, it is regarded as the most stable element. So, Ni-62 is used as a radiation shielding material in the embodiment of the present invention.

The radiation shielding layer 18 may be formed by subjecting Ni-62 to vacuum deposition or plating on the radioisotope layer 16.

In FIG. 1, the reference numeral 20 designates beta rays emitted to the P-type impurity layer 12 from the radioisotope layer 16.

Figure 2:
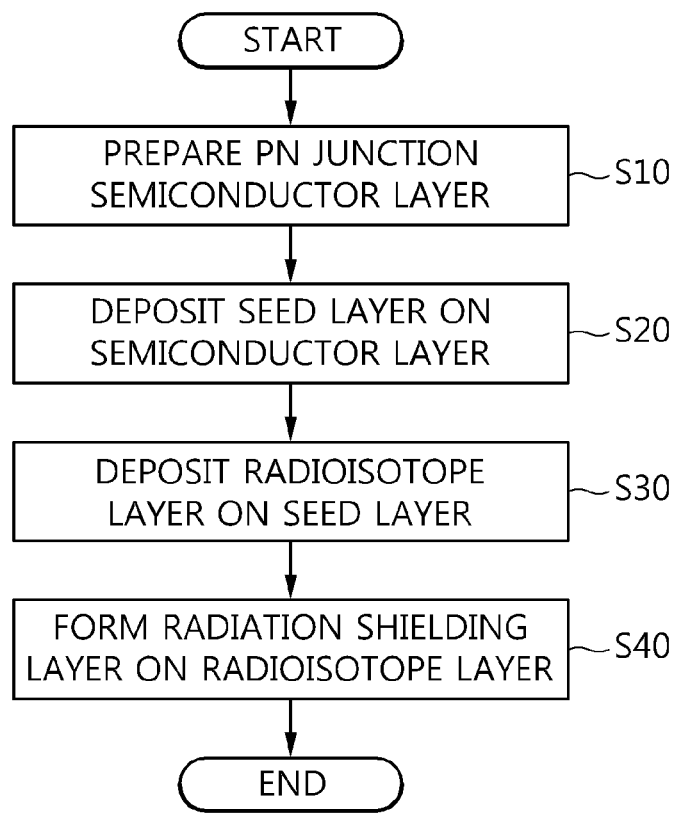
FIG. 2 is a flowchart illustrating a process of manufacturing the radioisotope battery according to an embodiment of the present invention.

Turning now to the flowchart of FIG. 2, a method of manufacturing the radioisotope battery according to an embodiment of the present invention is described below.

Specifically, a PN junction semiconductor layer 30 is prepared, wherein the P-type impurity layer 12 of the semiconductor layer 30 is disposed on the N-type impurity layer 10 (S 10). Herein, the process of forming the PN junction semiconductor layer 30 is well-known to those skilled in the art, and thus a description thereof is omitted.

Subsequently, a seed layer 40 is deposited on the P-type impurity layer 12 (S20).

Subsequently, a radioisotope layer 16 is formed on the seed layer 40. As such, the radioisotope layer 16 is deposited by plating Ni-63 in order to prevent pollution due to sputtering of Ni-63 (S30).

Subsequently, a radiation shielding layer 18 is formed on the radioisotope layer 16. In this case, Ni-62 is subjected to vacuum deposition or plating on the radioisotope layer 16, thereby forming the radiation shielding layer 18 (S40).

In the radioisotope battery according to the embodiment of the present invention, electrons corresponding to the beta-rays 20 are emitted from the radioisotope layer 16 deposited on the surface of the P-type impurity layer 12 and are then absorbed by the semiconductor layer 30. The semiconductor layer 30 makes electron-hole pairs using the absorbed beta-rays 20, thus generating current. As such, because the beta rays 20 emitted from the radioisotope layer 16 may be discharged to the outside, the radiation shielding layer 18 is responsible for radiation (i.e. beta rays) emitted from the radioisotope layer 16 being shielded from the outside.

As described hereinbefore, the present invention provides a radioisotope battery and a method of manufacturing the same. According to the present invention, a process of manufacturing a Si PN junction semiconductor for a radioisotope battery includes depositing an isotope Ni-63, and also a stable element Ni-62 is deposited thereon simultaneously with deposition of Ni-63, thereby simultaneously achieving fabrication of a radioisotope battery and shielding of radiation.

In particular, Ni-63 which is a beta-ray source of the radioisotope battery can be safely shielded, thereby preventing a person who uses the radioisotope battery from being exposed to radiation and diversifying the use of the radioisotope battery having a long lifespan.

As described above, the optimum embodiments have been disclosed in the drawings and the specification. Although the specific terms have been used herein, they have been used merely for the purpose of describing the present invention, and have not been used to limit the meanings thereof and the scope of the present invention set forth in the claims. Therefore, it will be understood by those having ordinary knowledge in the art that various modifications and other equivalent embodiments can be made. As a result, the technical range of the protections of the present invention should be defined by the technical spirit of the attached claims.

What is claimed is:

1. A radioisotope battery, comprising:
a semiconductor layer;
a seed layer formed on the semiconductor layer;
a radioisotope layer formed on the seed layer; and
a radiation shielding layer formed on the radioisotope layer and for shielding radiation of the radioisotope layer from outside.

2. The radioisotope battery of claim 1, wherein the radiation shielding layer comprises Ni-62.

3. The radioisotope battery of claim 1, wherein the radioisotope layer comprises Ni-63.

4. The radioisotope battery of claim 1, wherein the semiconductor layer is a PN junction semiconductor layer where a P-type impurity layer and an N-type impurity layer are in contact with each other, and
the seed layer is formed on the P-type impurity layer.

5. The radioisotope battery of claim 1, wherein the seed layer comprises Ni-62.

6. A method of manufacturing a radioisotope battery, comprising:
preparing a semiconductor layer;
depositing a seed layer on the semiconductor layer;
depositing a radioisotope layer on the seed layer; and
forming a radiation shielding layer for shielding radiation of the radioisotope layer from outside on the radioisotope layer.

7. The method of claim 6, wherein the radiation shielding layer comprises Ni-62, and
forming the radiation shielding layer is performed by subjecting Ni-62 to vacuum deposition or plating on the radioisotope layer.

8. The method of claim 6, wherein the radioisotope layer comprises Ni-63, and
depositing the radioisotope layer is performed by depositing Ni-63 using plating.

9. The method of claim 6, wherein the semiconductor layer is a PN junction semiconductor layer where a P-type impurity layer and an N-type impurity layer are in contact with each other, and
depositing the seed layer is performed by depositing the seed layer on the P-type impurity layer.

10. The method of claim 6, wherein the seed layer comprises Ni-62.

* * * * *